United States Patent [19]

Nakano et al.

[11] Patent Number: 5,665,168
[45] Date of Patent: Sep. 9, 1997

[54] METHOD FOR CLEANING SEMICONDUCTOR SILICON WAFER

[75] Inventors: Masami Nakano; Isao Uchiyama; Hiroyuki Takamatsu, all of Nishi-shirakawa-gun, Japan

[73] Assignee: Shin-Etsu Handotai Co., Ltd., Tokyo, Japan

[21] Appl. No.: 515,007

[22] Filed: Aug. 14, 1995

[30] Foreign Application Priority Data

Aug. 30, 1994 [JP] Japan .................. 6-205321

[51] Int. Cl.$^6$ ........................... B08B 3/00
[52] U.S. Cl. .................. 134/2; 134/3; 134/26; 134/28
[58] Field of Search .............. 134/2, 3, 26, 28, 134/1.2, 1.3

[56] References Cited

U.S. PATENT DOCUMENTS

| | | | |
|---|---|---|---|
| 4,582,624 | 4/1986 | Enjo et al. | 252/79.4 |
| 4,795,582 | 1/1989 | Ohmi et al. | 252/79.3 |
| 5,051,134 | 9/1991 | Schnegg et al. | |
| 5,181,985 | 1/1993 | Lampert et al. | 156/635 |
| 5,277,835 | 1/1994 | Ohmi et al. | 252/79.3 |
| 5,378,317 | 1/1995 | Kashiwase et al. | 156/659.1 |
| 5,397,397 | 3/1995 | Awad | 134/1 |
| 5,464,480 | 11/1995 | Matthews | 134/1.3 |

FOREIGN PATENT DOCUMENTS

| | | |
|---|---|---|
| 0 199 288 | 10/1986 | European Pat. Off. |
| 0 438 727 A2 | 7/1991 | European Pat. Off. |
| 62-198127 | 9/1987 | Japan |

OTHER PUBLICATIONS

T. Isagawa et al., "Ultra Clean Surface Preparation Using Ozonized Ultrapure Water", International Conference on Solid State Devices and Materials, Aug. 26–28, 1992, Tokyo, Japan, pp. 193–195.

*Primary Examiner*—Jill Warden
*Assistant Examiner*—Alexander Markoff
*Attorney, Agent, or Firm*—Oliff & Berridge

[57] ABSTRACT

A method for cleaning a semiconductor silicon wafer, which can suppress and reduce adhesion of particles to the surface of the wafer, is disclosed. The method includes the steps of cleaning the semiconductor silicon wafer by using hydrofluoric acid aqueous solution containing a surfactant, and thereafter rinsing the semiconductor silicon wafer by using pure water containing ozone.

5 Claims, 3 Drawing Sheets

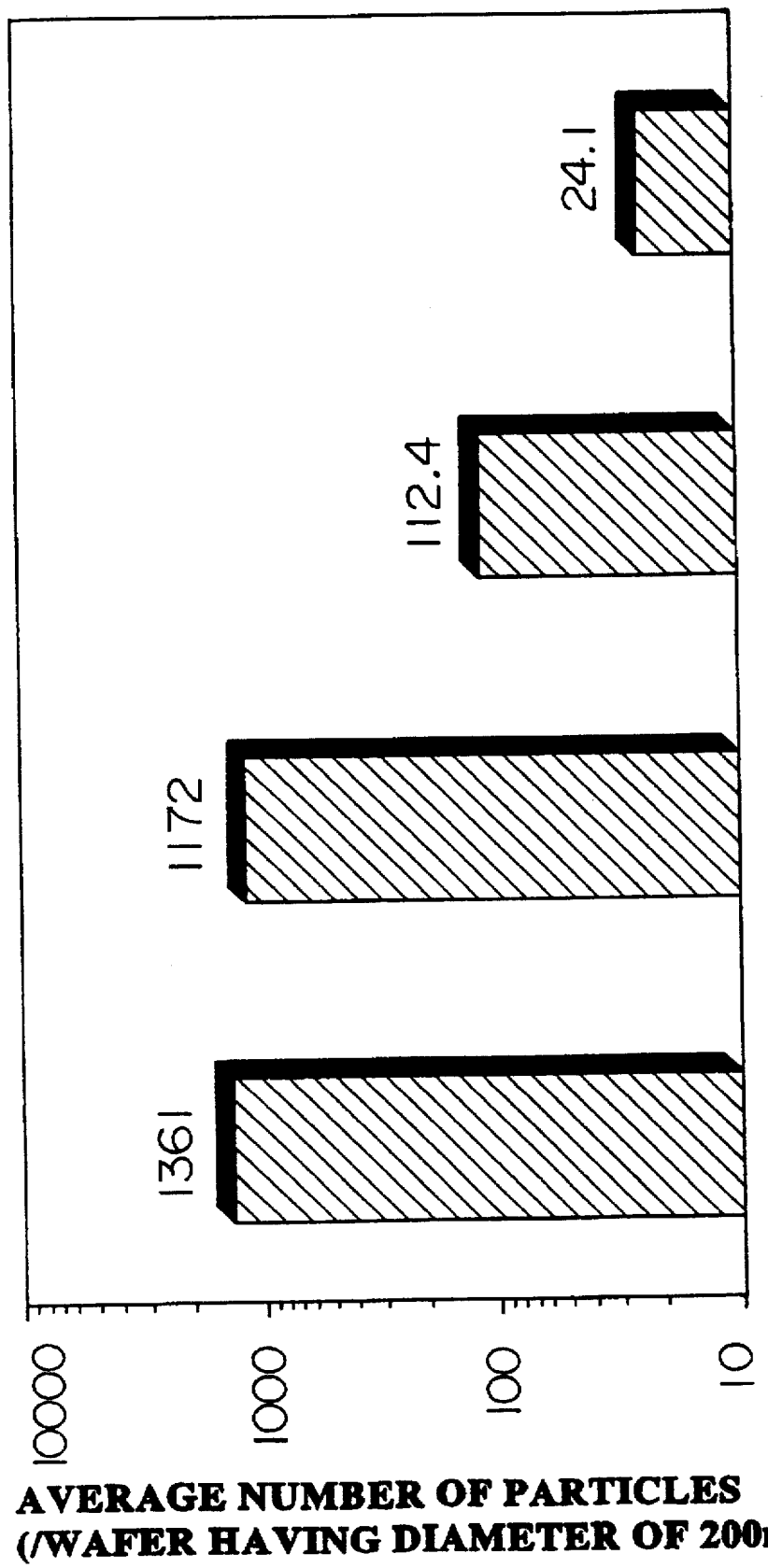

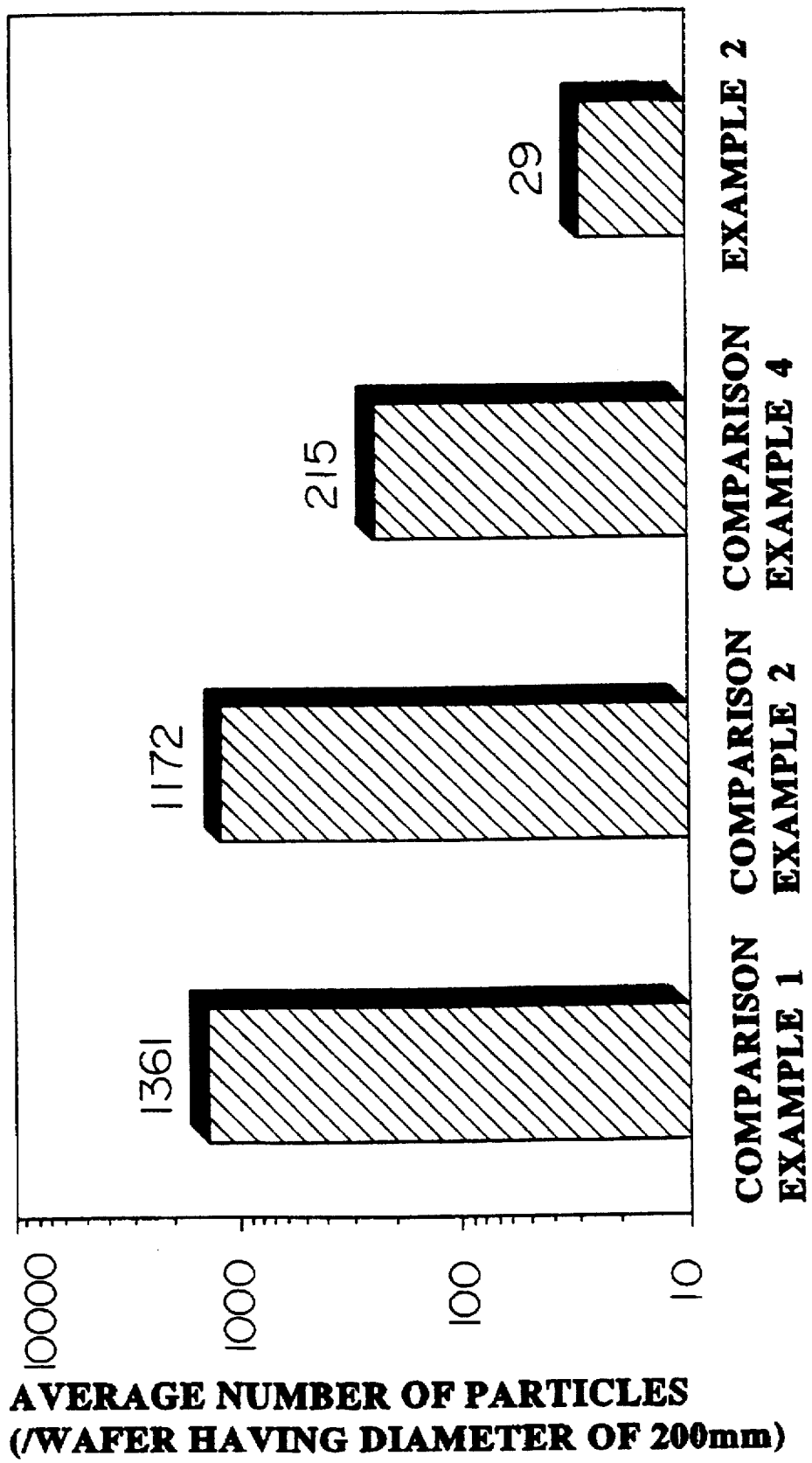

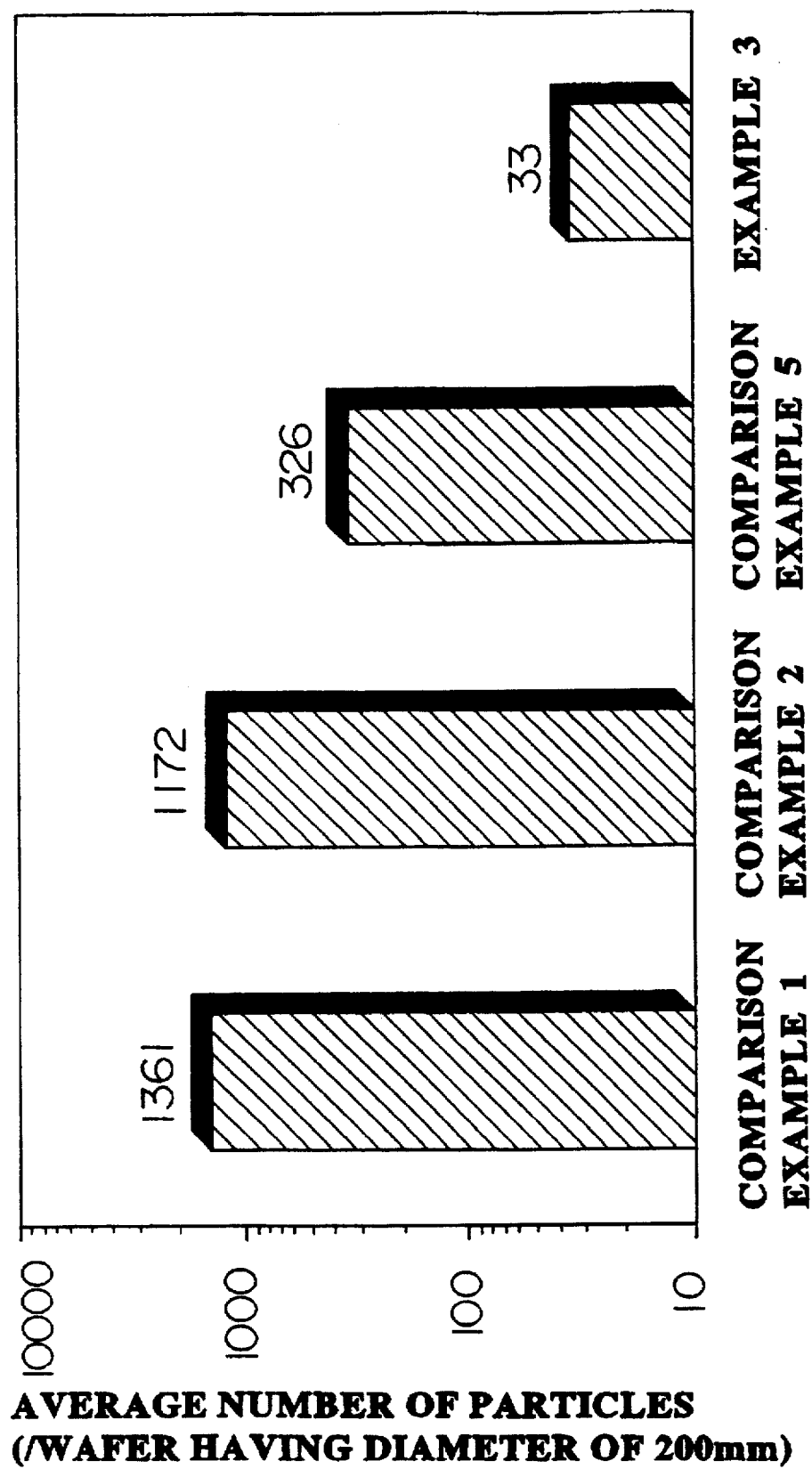

METHOD FOR CLEANING SEMICONDUCTOR SILICON WAFER

BACKGROUND OF THE INVENTION

1. Field of the Invention

The present invention relates to an improvement of a method for cleaning a semiconductor silicon wafer, which may be hereinafter referred to as a wafer, simply by using hydrofluoric acid.

2. Description of Related Art

Generally, hydrofluoric acid is used to remove an oxide film on the surface of the wafer, e.g., a thermal oxidation film, a CVD oxide film, a natural oxide film and the like. Because a treatment using hydrofluoric acid makes the surface of the wafer hydrophobic, it raises a problem of easily adhering particles to the surface of the wafer. Reduction of particles adhered to the surface of the wafer is required because such adhesion of particles brings reduction of yield of devices produced.

A method for cleaning the surface of a wafer by rinsing with pure water containing ozone after a cleaning which uses hydrofluoric acid has been suggested as a method for suppressing adhesion of particles to the surface of the wafer after a treatment using hydrofluoric acid, in Japanese Patent Application Laid-Open Publication No. Tokukai-sho 62-198127. Under the present conditions, such a proposed method is not enough to suppress or reduce adhesion of particles to the surface of the wafer after the treatment using hydrofluoric acid.

SUMMARY OF THE INVENTION

The present inventors have extensively studied in view of the above-mentioned problems so as to achieve the present invention. An object of the present invention is to provide a method for cleaning a semiconductor silicon wafer, which can effectively and sufficiently suppress and reduce adhesion of particles to the surface of the semiconductor silicon wafer.

In accordance with one aspect of the present invention, the method for cleaning a semiconductor silicon wafer comprises the steps of cleaning the semiconductor silicon wafer by using hydrofluoric acid aqueous solution containing a surfactant, and thereafter rinsing the semiconductor silicon wafer by using pure water containing ozone.

When a treatment using hydrofluoric acid is carried out on the surface of the wafer, because the surface of the wafer becomes hydrophobic, particles come to easily adhere to the surface of the wafer. In order to reduce adhesion of particles to the surface of the wafer, it is effective to keep the surface of the wafer hydrophilic. In the present invention, a film of a surfactant is formed on the surface of the wafer to make the surface hydrophilic by adding the surfactant in a hydrofluoric acid aqueous solution. Thereafter, the surfactant film formed on the surface of the wafer is removed by using pure water including ozone for rinsing the wafer which was treated by hydrofluoric acid, and a natural oxide film is formed on the wafer surface. Accordingly, the wafer surface can be kept hydrophilic, and it is possible to enhance the advantageous effect of preventing adhesion of particles to the wafer surface.

Preferably, the amount of the surfactant contained in the hydrofluoric acid aqueous solution is not less than 0.01% by weight. The amount of the surfactant may be not more than 5.00% by weight.

An amount of the added surfactant less than 0.01% by weight gives substantially no advantageous effect of reducing adhesion of particles, and an amount more than 5.00% by weight gives no further improved effect thereof and is not economical. The type of the surfactant is not limited in particular. Every one of non-ionic, anionic, or cationic surfactants can give a similar effect.

The above concentration of ozone to pure water is preferably not less than 0.5 ppm and the concentration up to the solubility may be used. The concentration of ozone to pure water less than 0.5 ppm gives substantially no advantageous effect of reducing adhesion of particles.

The concentration of hydrofluoric acid in the HF aqueous solution is not limited particularly so long as the cleaning by using the HF aqueous solution gives advantageous effects. Although the concentration of hydrofluoric acid is preferably in the range of 0.1–10% by weight, another concentration out of the range may be also used. Time for cleaning by hydrofluoric acid is preferably about 1–15 minutes, depending on the thickness of the oxide film on the surface of the wafer. Time for rinsing by water containing ozone is preferably about 1–10 minutes. More preferably, the time for rinsing is about 1–5 minutes.

BRIEF DESCRIPTION OF THE DRAWINGS

The above and further objects and novel features of the present invention will become more fully understood from the following detailed description when the same is read in connection with the accompanying drawings. It is to be expressly understood, however, that the drawings are for purpose of illustration only and are not intended as a definition of the limits of the present invention, and wherein:

FIG. 1 is a graph illustrating the measurement results of adhered particles to the surface of the wafer after cleanings according to the Example 1 and the Comparison Examples 1–3, FIG. 2 is a graph illustrating the measurement results of adhered particles to the surface of the wafer after cleanings according to the Example 2 and the Comparison Examples 1, 2 and 4, and FIG. 3 is a graph illustrating the measurement results of adhered particles to the surface of the wafer after cleanings according to the Example 3 and the Comparison Examples 1, 2 and 5.

DETAILED DESCRIPTION OF PREFERRED EMBODIMENTS

Hereinafter, the present invention will be concretely explained by preferred examples.

EXAMPLE 1

Experimental Condition

Sample wafer: 20 silicon wafers; p-type; crystal orientation of <100>; a diameter of 200 mmφ; having a CVD oxide film with a thickness of 300 nm.

Cleaning by hydrofluoric acid (HF): concentration of hydrofluoric acid of 5% by weight; aqueous solution temperature of 25° C.; cleaning time of 10 minutes; a non-ionic surfactant [Trade name: NCW-601A, produced by Wako Pure Chemical Industries, Ltd.] added in an amount of 0.5% by weight.

Rinsing by pure water containing ozone (O₃): supply of 2 liter per minute; pure water temperature of 25° C.; rinsing time of 3 minutes; ozone concentration of 2 ppm.

Vessel for hydrofluoric acid cleaning: 320×30×280 (mm).

Vessel for rinsing: 320×30×200 (mm).

Twenty sample wafers were cleaned by using hydrofluoric acid under the above-described conditions and thereafter rinsed by pure water containing ozone. The number of particles, (number/200 mmφ) each of which has a diameter not less than 0.11 μm on these wafers which had been cleaned by using hydrofluoric acid, was measured by a laser particle counter LS-6000 produced by Hitachi Electronics Engineering Co., Ltd. The result of the measurement is shown in FIG. 1. The average measured number of particles was 24.1/200 mmφ.

COMPARISON EXAMPLE 1

Twenty other sample wafers were cleaned and rinsed under conditions similar to that of the Example 1 except that no surfactant was added in the hydrofluoric acid aqueous solution and that the pure water included no ozone. The number of particles on these wafers was similarly measured. The result of the measurement is shown in FIGS. 1, 2 and 3. The average measured number of particles in this case was 1361/200 mmφ.

COMPARISON EXAMPLE 2

Twenty other sample wafers were cleaned and rinsed under conditions similar to that of the Example 1 except that no surfactant was added in the hydrofluoric acid aqueous solution. The number of particles on these wafers was similarly measured. The result of the measurement is shown in FIGS. 1, 2 and 3. The average measured number of particles in this case was 1172/200 mmφ.

COMPARISON EXAMPLE 3

Twenty other sample wafers were cleaned and rinsed under conditions similar to that of the Example 1 except that the pure water included no ozone. The number of particles on these wafers was similarly measured. The result of the measurement is shown in FIG. 1. The average measured number of particles in this case was 112.4/200 mmφ.

EXAMPLE 2

Twenty other sample wafers were cleaned by using hydrofluoric acid and thereafter rinsed by pure water containing ozone, under conditions similar to that of the Example 1 except that 0.1% by weight of an anionic surfactant [Trade name: Unidine DS-101, produced by DAIKIN INDUSTRIES, LTD.] was added instead of a non-ionic surfactant. The number of particles was similarly measured. The result of the measurement is shown in FIG. 2. The average measured number of particles was 29/200 mmφ.

COMPARISON EXAMPLE 4

Twenty other sample wafers were cleaned and rinsed under conditions similar to that of the Example 2 except that the pure water included no ozone. The number of particles on these wafers was similarly measured. The result of the measurement is shown in FIG. 2. The average measured number of particles in this case was 215/200 mmφ.

EXAMPLE 3

Twenty other sample wafers were cleaned by using hydrofluoric acid and thereafter rinsed by pure water containing ozone, under conditions similar to that of the Example 1 except that 0.1% by weight of a cationic surfactant [Trade name: Unidine DS-202, produced by DAIKIN INDUSTRIES, LTD.] was added instead of a non-ionic surfactant. The number of particles was similarly measured. The result of the measurement as shown in FIG. 3. The average measured number of particles was 33/200 mmφ.

COMPARISON EXAMPLE 5

Twenty other sample wafers were cleaned and rinsed under conditions similar to that of the Example 3 except that the pure water included no ozone. The number of particles on these wafers was similarly measured. The result of the measurement is shown in FIG. 3. The average measured number of particles in this case was 326/200 mmφ.

It is clearly observed from the results of FIGS. 1–3 that only one step of adding a surfactant in a hydrofluoric acid aqueous solution can give the effect of suppressing adhesion of particles to the wafer surface to a certain extent, as indicated in Comparison Examples 3, 4 and 5. However, the one step alone is not sufficient because lower levels of particle contamination are preferable. It is confirmed that by adding ozone to the pure water of the Comparison Examples 3, 4 or 5, the number of measured particles is further decreased, so that the levels of particle contamination are extremely lowered.

In the above-described embodiments, although only 5% by weight of concentration of hydrofluoric acid is illustrated, the concentration of hydrofluoric acid is not particularly limited so long as the cleaning by using hydrofluoric acid aqueous solution gives advantageous effects. In general, a concentration of hydrofluoric acid in the range of 0.1–10% by weight is sufficient, and another concentration out of the range can be also used. In the embodiments, only p-type of sample wafers are used. However, it is confirmed that also n-type of wafers give advantageous effects similarly. The time for cleaning by hydrofluoric acid is preferably about 1–15 minutes, depending on the thickness of the oxide film on the surface of the wafer. The concentration of the ozone is preferably not less than 0.5 ppm. The concentration up to the solubility thereof can be used, and the upper limit thereof is about 40 ppm at a solution temperature of at least 25° C. Rinsing time by water containing ozone is preferably about 1–10 minutes. More preferably, the time for rinsing is about 1–5 minutes.

As described above, according to the method for cleaning a wafer of the present invention, it is possible to extremely reduce adhesion of particles to the surface of the wafer and therefore to solve the problem of a lowering of yield.

What is claimed is:

1. A method for cleaning a semiconductor silicon wafer comprising the steps of:

cleaning the semiconductor silicon wafer by using hydrofluoric acid aqueous solution containing a surfactant and thereafter rinsing the semiconductor silicon wafer by using water containing ozone, wherein the concentration of the surfactant contained in the hydrofluoric acid aqueous solution is in the range 0.01%–5.00% by weight, and the concentration of the ozone contained in the water is not less than 0.5 ppm.

2. A method as claimed in claim 1, wherein the concentration of the ozone contained in the water is not more than the solubility thereof.

3. A method as claimed in claim 1, wherein the concentration of hydrofluoric acid in the hydrofluoric acid aqueous solution is in the range of 0.1–10% by weight.

4. A method as claimed in claim 1, wherein the cleaning by using hydrofluoric acid aqueous solution is carried out for 1–15 minutes.

5. A method as claimed in claim 1, wherein the rinsing by using water containing ozone is carried out for 1–10 minutes.

* * * * *